Figure 1A:
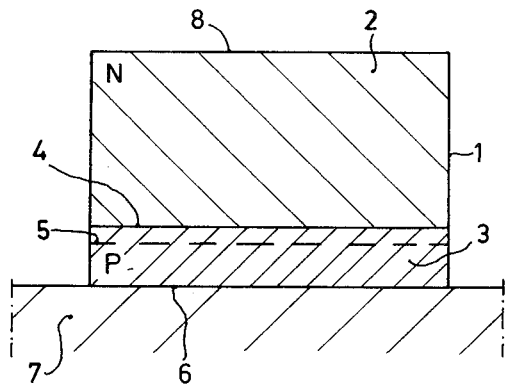

United States Patent [19]

Vahe

[11] 4,094,752
[45] June 13, 1978

[54] METHOD OF MANUFACTURING OPTO-ELECTRONIC DEVICES

[75] Inventor: Jacques Vahe, Aunay, Odon, France

[73] Assignee: U.S. Philips Corporation, New York, N.Y.

[21] Appl. No.: 638,901

[22] Filed: Dec. 8, 1975

[30] Foreign Application Priority Data

Dec. 9, 1974 France .................... 74 40216

[51] Int. Cl.² ......................................... H01L 21/306
[52] U.S. Cl. ................... 204/129.95; 156/628; 156/648; 156/655; 350/96.34
[58] Field of Search ............. 156/3, 7, 8, 17, 628, 156/648, 649, 655, 659, 662, 657; 148/175, 174; 29/579, 580; 204/129.35, 129.4, 129.65, 129.75, 129.95, 129.8; 357/16, 17, 18, 56; 350/96 WG, 96 C

[56] References Cited

U.S. PATENT DOCUMENTS

| | | | |
|---|---|---|---|
| 3,302,051 | 1/1967 | Galginaitis | 357/17 |
| 3,679,501 | 7/1972 | Chicotka | 156/662 |
| 3,756,877 | 9/1973 | Muroaka et al. | 156/649 |
| 3,801,391 | 4/1974 | Dyment et al. | 357/56 |
| 3,833,435 | 9/1974 | Logan et al. | 357/16 |
| 3,892,606 | 7/1975 | Chappelow et al. | 156/17 |
| 3,894,895 | 7/1975 | Khandelwal | 156/17 |
| 3,913,215 | 10/1975 | Heckl | 156/648 |
| 3,929,531 | 12/1975 | Hattori et al. | 156/17 |
| 3,959,098 | 5/1976 | Schwartz | 204/129.75 |

*Primary Examiner*—William A. Powell
*Assistant Examiner*—Jerome W. Massie
*Attorney, Agent, or Firm*—Frank R. Trifari; Norman N. Spain

[57] ABSTRACT

A method of manufacturing opto-electronic semiconductor devices.

The method is characterized in that the material is $AsAl_xGa_{1-x}$ in which the molar proportion $x$ is lower than 0.3, in that the material is stratified in different layers, and in that a chemical etching treatment is carried out in a bath containing hydrofluoric acid, nitric acid and acetic acid.

16 Claims, 3 Drawing Figures

METHOD OF MANUFACTURING OPTO-ELECTRONIC DEVICES

The present invention relates to a method of manufacturing opto-electronic devices, notably starting from a semiconductor plate.

The present invention also relates to devices manufactured by the method according to the invention and to etching baths necessary for carrying out the method.

Opto-electronic devices are to be understood to mean herein light-emitting devices, so-called electroluminescent devices, and light-receiving devices, so-called photo-electric devices.

It is known that gallium aluminium arsenide and gallium arsenide are now frequently used in semiconductor industry, in particular in the branch of same which is called opto-electronics, where they permit to provide notably electroluminescent diodes emitting in the red and in the infra-red.

The monocrystalline ternary semiconductor material composed of arsenic, gallium and aluminium, $Ga_{1-x}Al_x$As, of which the composition is such that the molar proportion of aluminium $x$ with respect to the assembly of aluminium and of gallium entering into the combination is lower than 0.34 for a corresponding relative molar proportion $1-x$ of gallium of $n$-type, permits the creation by zinc diffusion of junctions generating, at normal temperature, a radiation the wavelength of which depends on $x$. Said wavelength is in the red for $x = 0.3$.

When $x = 0$, the material is gallium arsenide which emits in the infra-red. The invention described in the present specification applies to gallium arsenide which is considered here as $Ga_{1-x}Al_x$As for which $x = 0$.

It is known that, due to the high value of the index of refraction of semiconductor bodies which involve a small value for the critical angle of refraction, it is extremely difficult to extract the light created inside a crystal.

It is known that the light extraction may be improved, which is termed the optical coupling of a device to the atmosphere, by giving the crystal a certain number of shapes of which the best and the best known is that a WEIERSTRASS sphere constituting the output face of the light emission, of which sphere the WEIERSTRASS point is occupied by the region of radiative recombination where the said light is created. The creation of a perfect WEIERSTRASS system of semiconductor material is difficult and expensive. In addition, said system is of no help for the light fraction emitted in the opposite direction for which it is desired that it should be reflected towards the front of the device.

The present invention provides a solution to said problems.

Actually, Applicants have performed numerous studies on the crystal shapes and structures which are favorable for a good optical coupling and which can be obtained at moderate costs.

The present invention takes into consideration the difference between the etching rates by chemical means or electrolytic means of the semiconductor materials according to their type, or the nature of their doping and their method of manufacturing.

In fact, the present invention relates to a method of manufacturing opto-electronic devices from a semiconductor plate, characterized in that the semiconductor material is mainly constituted by gallium aluminium arsenide of the general formula $AsAl_xGa_{1-x}$, in which the molar proportion $x$ of aluminium is lower than 0.3, in that, in the said plate, the said material is stratified in different layers, and in that an etching treatment is carried out in a bath containing hydrofluoric acid, nitric acid and acetic acid.

Advantageously, the mixture constituting the said bath is prepared in the following proportions:
hydrofluoric acid, 50% by volume: 2 to 4 volume parts
nitric acid, density 1.38: 3 to 7 volume parts
glacial acetic acid: 2 to 4 volume parts.

Preferably, the central part of the said proportion ranges is used:
hydrofluoric acid, 50% by volume: 2.5 to 3.5 volume parts
nitric acid, density 1.38: 4 to 6 volume parts
glacial acetic acid: 2.5 to 3.5 volume parts It is to be noted that said etching can be used no matter what is the orientation of the crystal. It is particularly well adapted to the crystals of which the principal faces are oriented according to the 100 faces.

The surface of the device is really passivated, for, besides an excellent cleaning, there is the creation of an oxide layer of a very good quality; said passivation role is particularly effective for all planar semiconductor structures.

In fact, the present invention uses the difference between the different degrees of chemical activity of a material of the same molar composition according as it has been doped in such manner as to have a higher or lower $n$-type or $p$-type conductivity.

It is in fact generally known that the chemical activity which produces the rate at which a $Ga_{1-x}AsAl_n$ of a given molar composition is etched, is, for a given conductivity type, higher according as the doping level is high, and when the doping level is equal, is higher for the $p$-type than for the $n$-type.

According to the first embodiment of the present invention, in a plate comprising a preferably thick layer having a substantially constant composition in the vicinity of a free main face, the lateral faces being maintained free at least partially, the circumference of the said free face is given a convex curved shape, approaching that of an arc of a circle, and, if desired, said free face is given the shape of a dome. It should be clear that said possibility results precisely from the fact that the said solution etches all the crystal planes in a nearly equivalent manner.

By the choice of the dimensions of the substrate, notably of its thickness with respect to the dimensions of the main faces, and by the choice of the duration of the etching treatment, a diopter may be obtained which, for example, may constitute or form part of an optical device favouring, by its free face thus formed, the output of light rays emitted deeper in the stratified plate.

It is generally advantageous, for this operation, that the face opposite to the said main face which is to be formed be masked either by another layer, or by the presence of a base plate, or by any other means in such manner as to avoid the etching of said opposite face.

In a second embodiment of the present invention, there is formed in a plate a layer the doping of which, either by its type or by its level, makes it more etchable than at least one of the layers adjacent same. In this manner the area of said layer may be reduced with respect to the area of the adjacent layers and, in this way, for example, the area of its junction with an adjacent layer may be reduced and a zone of radiative recombination of a limited area created, said zone being disposed in favourable points of an optical system created separately or simultaneously.

There may be started notably from a plate comprising a thick substrate having a weak reactivity, for example of the n-type and low doping ($10^{16}$cm$^{-3}$ < $N_D$ < $2.10^{16}$cm$^{-3}$) on which there is provided as more highly doped epitaxial layer of the p-type, for example, of silicon ($10^{19}$cm$^{-3}$ < $N_A$ < $10^{20}$cm$^{-3}$).

It is known that in such an assembly the zone of radiative recombinations from which the light is emitted is present in the p-region. Experience proves that with the dimensions well chosen, for example, with a circular plate of As Ga having a diameter of the order of 200 to 400 μm manufactured from a substrate of 100 to 150 μm thickness, comprising an epitaxial layer of the p-type having a thickness of 30 to 80 μm, there may be obtained, by a single etching treatment, the removal of the peripheral domain of the p-layer to a depth of 20 to 50 μm and the formation of the free face of the n substrate in a form approaching that of a part of a sphere.

Due to said spherical shape and the place of the junction, the optical coupling of the subsisting radiative region is excellent. The eliminated domain on the contrary, would have a worse optical coupling and would consume electrical energy. Thus the efficiency is ameliorated.

In other words, since the area of the junction can be diminished, the density of photons emitted for a given current can be augmented, which is important.

It may be advantageous to effect the said etching treatment after mounting the assembly on a support or a base which is inert with respect to the chemical solution proposed or after providing the rear contact of the plate, if the same is not attacked by the said solution, which permits a bulk etching of the pieces and avoids the formation of a rounding on the face of the p-type layer opposite to the junction.

In a third embodiment of the present invention there is provided a plate comprising at least a layer the doping level of which varies progressively from a first main face of the said layer to a second main face opposite to the first, and the duration of the etching treatment is controlled in such manner that the lateral face of the said layer acquires an acute angle with the plane of the said first main face and an obtuse angle with the plane of the said second main face.

It will be obvious that the angle considered is that which opens on the side of the device and not its supplement.

In this embodiment, the invention permits of obtaining truncated shapes, or approaching that of the frustum of a cone, particularly adapted to the reflection.

A thus shaped layer constitutes an optical device which, when disposed opposite to the output face of the light, sends back on the suitable side a part of the light emitted by the junction in the direction opposite to that of the said output face. In order to understand the advantage provided by the invention, it should be noted that in the beam of light emitted initially by the radiative recombination region in the direction opposite to the junction, the beam emitted at an angle of incidence smaller than the critical angle is lost, in the absence of a reflecting layer, while the remainder of the beam experiences a total reflection. If the lateral faces of said crystal layer enclose a right angle with the main face, the reflection of said beam which is extremely important due to the small value of the critical angle $\theta 1$ of gallium aluminium arsenide due to the high value of their index of refraction $n_r$(for AsGa $n_r$ = 3.6 and $\theta 1$ = 16.2°), is entirely lost, either by output through the lateral faces for the beam having an initial angle of incidence $(\pi/2) - \theta 1$, or, for the remainder of the beam, by trapping on the inside of the crystal and absorption by same following successive total reflections.

If the lateral faces of said crystal layer enclose an obtuse angle $\alpha$ with the main face opposite to the output face, a non-negligible fraction of the residual beam approximately proportional to the value of the critical angle may emerge from the crystal through the output face. For given values of the critical angle $\theta 1$ and the angle $\alpha$, the fraction of the beam issued by a punctiform source which may thus emerge favourably is that of which the angle of incidence on the main face opposite to the output face lies between $2\alpha - \pi$ and $2\alpha - \pi + \theta 1$. A shape of the lateral faces according to a curve in the form of a cavity still ameliorates the optical coupling of the crystal to the atmosphere. Said shape may be obtained by a careful control of the variation of the doping of the successive layers of the said epitaxial layer.

The above-described three embodiments may be used notably simultaneously on the same crystal assembly to create a given device. On an n-type substrate of which the doping level is low and substantially constant, at least for a certain thickness on the side of the first main face which is left free, a p-type layer is provided on the second main side of said substrate opposite to the first, the doping level of which layer increases from the face of the said layer in interface with the said substrate to the opposite face of the said layer. The duration of the etching treatment is controlled in such manner that the profile of the said substrate of the n-type on the side of the free face in the vicinity of the free face takes the form of a convex curve approaching that of an arc of a circle, while the area of the interface and hence of the region of radiative recombination which emits the light is reduced and the profile of the layer of the p-type becomes trapezoidal. Thus the optical coupling is maximum. The doping level of the substrate of the n-type may preferably be between $10.^{16}$ and $2.10^{18}$ impurity atoms per cm$^3$ and the layer of the p-type may comprise a level of silicon atoms increasing from a value between $5.10^{18}$ and $10^{19}$ atoms per cm$^3$ at the level of the interface to a value between $10^{19}$ and $10^{20}$ atoms per cm$^3$ at the level of the face of the said layer opposite to the said interface.

Advantageously, the substrate of the n-type may itself comprise an epitaxial layer of the n-type which is more highly doped than the original crystal and possibly of a doping level increasing from the original substrate. Due to the presence of said layer of a higher doping level, the number of carriers diffused from the n-zone towards the p-zone augments and consequently the number of radiative recombinations also augments. The light emission is thus more important while the starting crystal permits the obtaining of the form of a dome which is desired for the output face. Moreover, since the highly doped layer is etched laterally more rapidly than the starting crystal, and the more so when it is epitaxial, and the original epitaxial layers are etchable more rapidly than the crystals cut in the mass, the area of the radiative recombination is more easily reduced. In said n-type layer of an increasing doping level, the level of silicon may increase from a value between $10^{17}$ and $5 \times 10^{17}$ atoms per $cm^3$ in the vicinity of the interface with the said $n$-type substrate to a value between $10^{18}$ and $5 \times 10^{18}$ atoms per $cm^3$ in the vicinity of the interface with the said $p$-type layer.

The chemical etching may be accelerated by the application of an external electric voltage from a source of which the negative terminal is connected to the piece to be etched. Preferably, the electrolytic current is between 10 and 50 mA per $mm^2$ of etched surface.

It is generally convenient to mount the said crystal to be etched on a base which is at least partially metallic and of which at least the metallic parts are covered with a noble metal, for example gold.

It will be obvious that the present invention applied to the manufacture of electroluminescent devices may also be used for the manufacture of optoelectronic light receiver devices.

Figure 1B:
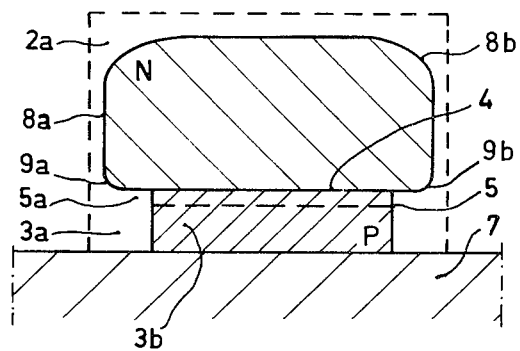

The invention will now be described in greater detail with reference to the accompanying drawings in which FIGS. 1a and 1b show two stages of the manufacture of an elementary electroluminescent device obtained by the method according to the invention.

Figure 2:
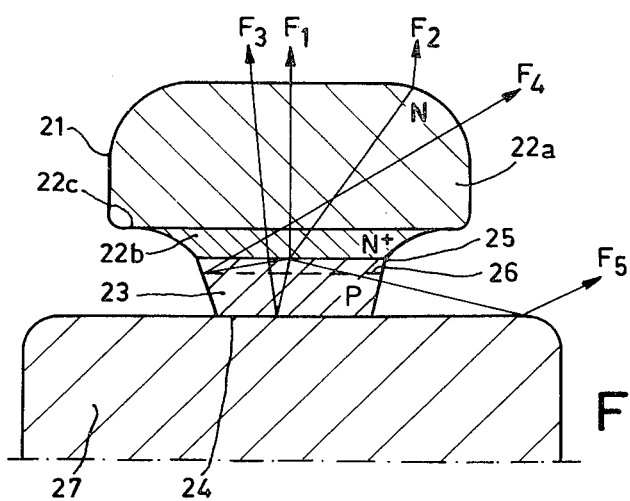

FIG. 2 shows the manufacture of a modified embodiment.

As is shown in FIGS. 1a and 1b starting material is a semiconductor plate 1 of gallium arsenide constituted on the one hand by a substrate 2 of the $n$-conductivity type and weakly doped ($10^{16}cm^{-3} < N_D < 2 \times 10^{18}cm^{-3}$) and on the other hand by an epitaxial layer 3 of the $p$-type which is more highly doped and is notably doped with amphoteric silicon (for example $10^{19}cm^{-3} < N_A < 10^{20}cm^{-3}$).

The substrate 2 may be chosen to be circular, its diameter then being of the order of 300 $\mu$m; for reasons of mechanical rigidity and also for reasons of proportionality between the speed and the depth of the chemical etching in the lateral direction and in the transverse direction, a relation should be determined between the value of the diameter of the substrate and that of its thickness; the thickness of the said substrate is therefore chosen in a range between 100 and 150 $\mu$m.

In order to determine the thickness of the epitaxial layer 3, the fact is to be considered that the injected carriers recombine in the said layer, which is why the thickness is at least equal to twice the diffusion length of the said carriers, but, to permit a sufficient etching, it should be more important: therefore, there is generally chosen between 30 and 80 $\mu$m, for example 30 $\mu$m.

The opposition of the conductivity types of the substrate 2 and of the layer 3 produce the junction 4. The zone of radiative recombination is situated on the side of the $p$-type region, hence in the layer 3, and is bounded in the Figure by the broken line 5.

The plate 1 is soldered with its face 6 to a support 7 of a material which is not etched by the acid, for example an Fe-Ni-Co alloy, covered with a layer of gold, the face 8 opposite to the face 6 remaining free (FIG. 1a).

After the plate 1 has been immersed in a bath according to that defined in the present invention, a device is obtained as shown in FIG. 1b. The etching bath may be constituted, for example, by a mixture of three volume parts of hydrofluoric acid of 50%, five volume parts of nitric acid of density 1.38 and three volume parts of glacial acetic acid.

In accordance with said FIG. 1b, the substrate 2 on the side of its free face 8 and on the side of the lateral faces 8a which are also free, has been subjected to an etching treatment which has diminished its thickness and which has eliminated on the peripheries a portion 2a, the said periphery now taking a rounded form 8b. In addition, the layer 3 has lost its peripheral domain 3a so that only the interior domain 3b remains; hence the area of the junction 4 has diminished and the area of the radiative zone bounded by the broken line 5 has also diminished.

Said etching treatment produces an amelioration from an electric point of view; in fact, for a current identical to that of a standard device, the efficiency is augmented, since in the portion 5a of the radiative zone eliminated simultaneously with the portion 3a, the emitted photons would have been lost.

It is to be noted that, in the vicinity of the junction 4, the substrate comprises on its periphery rounded portions 9a and 9b of dimensions smaller than those of the roundings 8a, which rounded portions have been created by the chemical etching treatment but do not cause disturbances in the emission of radiation.

FIG. 2 shows the manufacture of a modified embodiment starting from a semiconductor crystal 21 of gallium arsenide. Said crystal 21 comprises a substrate 22 of $n$-conductivity type of which the portion 22a has a constant doping and of which the portion 22b is more highly doped, the doping of the latter portion increasing regularly from the interface 22c between the said portions 22a and 22b.

On the outer face of portion 22b is deposited a layer 23 of $p$-conductivity type the doping level of which increases equally regularly from the interface with the portion 22b to its outer face 24.

The opposition of the conductivity types of the substrate 22 and the layer 23 produce the junction 25 and the zone of radiative recombination situated on the side of the $p$-type region is bounded by the broken line 26.

The crystal 21 is soldered by its face 24 to a support 27 which may be, for example, a base of the SOT type 18 of a material which is not attacked by the acids, notably an alloy of Fe-Ni-Co covered by a layer of gold.

In accordance with the invention, the crystal 21 is then etched in a bath identical to that described above, the duration of the said etching being of the order of 15 to 20 seconds. The shape shown in FIG. 2 is then obtained according to which the portion 22a of the $n$-type is rounded and according to which the portion 22b is etched laterally, the layer 23 of the $p$-type being also etched laterally and taking a conical configuration. In these conditions, the area of the junction 25 and the volume of the zone of radiative recombination 26 are diminished but the conical shape of the layer 23 facilitates the reflection of radiations and hence favours the emission of the said radiations towards the exterior.

The etching of the crystal may even be favoured by performing an electrolytic etching, the said crystal, immersed in the same etching bath, being connected to the negative terminal of a supply source the positive terminal of which is connected to an electrode of platinum which is also immersed in the etching bath. In this case a value of the etching current is chosen which lies between 10 and 50 mA, for example 30 mA, and the duration of the chemical etching is at most about 10 seconds.

FIG. 2 shows a few radiations issued from the radiative zone 26. Some, $F_1$ and $F_2$, traverse directly the region 22a of the substrate 22 and, taking into account the optical laws, can leave the device, others, $F_3$ and $F_4$, are reflected on the face 24 or on the walls of the p-type layer of a conical shape which are particularly adapted for reflection.

Consequently it is found that the etching according to the invention hence permits of sending back on the suitable side a part of the light emitted by the junction in the opposite direction and hence permits of augmenting the efficiency. It may also be thought that, since the surface of the support 27 is gold-plated, certain rays $F_5$ which traverse the lateral walls of the layer 23 are reflected in the proper direction and participate in the augmentation of the efficiency of the device.

What is claimed is:

1. A method of manufacturing opto-electronic devices starting from a semiconductor plate mainly constituted by stratified layers of gallium aluminum arsenide of the general formula $AsAl_xGa_{1-x}$ in which the molar proportion $x$ of aluminum is lower than 0.3, wherein an etching treatment is carried out on said plate in a bath containing hydrofluoric acid, nitric acid and acetic acid for a time sufficient to obtain a desired configuration.

2. A method as claimed in claim 1, characterized in that the mixture constituting the bath is prepared in the following proportions:
   hydrofluoric acid, 50% by volume: 2 to 4 volume parts
   nitric acid, density 1.38: 3 to 7 volume parts
   glacial acetic acid: 2 to 4 volume parts.

3. A method as claimed in claim 2, characterized in that the said mixture is prepared in the following proportions:
   hydrofluoric acid, 50% by volume: 2.5 to 3.5 volume parts
   nitric acid, density 1.38: 4 to 6 volume parts
   glacial acetic acid: 2.5 to 3.5 volume parts.

4. A method as claimed in claim 3, characterized in that the said plate comprises at least one layer of which a first main face is masked while the second main face opposite to the first and at least a part of the lateral faces adjacent the said second main face are free and in that the duration of the etching treatment is controlled in such manner that the profile of the said layer takes the shape of a convex curve at least in the vicinity of the periphery of the said second main face.

5. A method as claimed in claim 3, characterized in that the said plate comprises at least one first layer of which at least one of its main faces comprises masking elements, while the lateral faces are free, and in that the duration of the etching treatment is controlled in such manner that the area of the said first layer is reduced with respect to the area of the masking elements.

6. A method as claimed in claim 5, characterized in that the said layer is of the p-type and in that at least one of the masking elements is a layer of the n-type.

7. A method as claimed in claim 5, characterized in that the said layer has a given doping level, while at least one of the masking elements is of a semiconductor material having a lower doping.

8. A method as claimed in claim 3, characterized in that the said plate comprises at least one layer of which the variable doping level increases from a first main face of the said layer to a second main face of the said layer opposite to the first and in that the duration of the etching treatment is controlled in such manner that the lateral face of the said layer acquires an acute angle with the plane of the said first main face and an obtuse angle with the plane of the said second main face.

9. A method as claimed in claim 4, characterized in that the said plate comprises a substrate of the n-type of which the doping level is substantially constant, at least for a certain thickness on the side of the second main face, in that the said second main face is maintained free, while the first main face opposite to the second comprises a p-type layer of which the doping level increases from the face of the said layer in interface with the said substrate up to the opposite face of the said layer and in that the duration of the etching treatment is controlled in such manner that the profile of the said n-type substrate on the side of the free face, at least in the vicinity of the periphery of the said free face, presents the form of a convex curve, while the profile of the said p-type layer becomes trapezoidal.

10. A method as claimed in claim 9, characterized in that the said n-type substrate comprises, on the side of the said first main face opposite to the second, a layer of which the doping level is higher than the doping level of the first layer of the substrate.

11. A method as claimed in claim 10, characterized in that the n-type substrate is of gallium arsenide comprising in the thickness of substantially constant impurity level a value of the said impurity level between $10^{16}$ and $2.10^{18}$ impurity atoms per $cm^3$ and in the layer of increasing doping level, a level of silicon increasing from a value between $10^{17}$ and $5.10^{17}$ impurity atoms per $cm^3$ in the vicinity of the interface with the said n-type substrate to a value between $10^{18}$ and $5.10^{18}$ impurity atoms per $cm^3$, and in that the said p-type layer comprises an increasing level of silicon atoms of which the value is between $5.10^{18}$ and $10^{19}$ atoms per $cm^3$ at the level of the interface to a value between $10^{19}$ atoms and $10^{20}$ atoms per $cm^3$ at the level of the face of the said layer opposite to the interface.

12. A method as claimed in claim 1, characterized in that the etching is accelerated by the application of an outer electric voltage from a source of which the negative terminal is connected to the piece to be etched.

13. A method as claimed in claim 12, characterized in that the electrolytic etching current is between 10 and 50 mA per $mm^2$ of etched surface.

14. A method as claimed in claim 1, characterized in that the said piece to be etched is previously mounted on a base which is at least partially metallic and of which at least the metallic parts are covered with a noble metal.

15. A method as claimd in claim 14, characterized in that the said noble metal is gold.

16. A method of manufacturing an opto-electronic device from a semiconductor plate mainly constituted by gallium arsenide of the general formula $AsAl_xGa_{1-x}$ in which the molar proportion $x$ of aluminum is lower than 0.3, said plate comprising an n type substrate having a first free face and a second face covered with a p-type layer, an etch resistant mask covering the outer face of said p-type layer and having unmasked lateral faces, said method comprising etching said plate in a bath containing hydrofluoric acid, nitric acid and acetic acid for a time such that, at least in the vicinity of the periphery of said first free face of said substrate, the profile of said substrate takes the shape of a convex curve while the area of said p type layer is reduced appreciably.

* * * * *

UNITED STATES PATENT AND TRADEMARK OFFICE
CERTIFICATE OF CORRECTION

PATENT NO. : 4,094,752
DATED : June 13, 1978
INVENTOR(S) : JACQUES VAHE

It is certified that error appears in the above-identified patent and that said Letters Patent are hereby corrected as shown below:

Claim 9, line 14, "a least" should be --at least--
Claim 15, line 50, "claimd" should be --claimed--

Signed and Sealed this

Eighth Day of May 1979

[SEAL]

Attest:

RUTH C. MASON
Attesting Officer

DONALD W. BANNER
Commissioner of Patents and Trademarks